(12) United States Patent
Humbs et al.

(10) Patent No.: US 7,557,369 B2
(45) Date of Patent: Jul. 7, 2009

(54) DISPLAY AND METHOD FOR MANUFACTURING THE SAME

(75) Inventors: Werner Humbs, Berlin (DE); Michael Redecker, Berlin (DE); Markus Schaedig, Wusterhausen (DE)

(73) Assignee: Samsung Mobile Display Co., Ltd., Suwon (KR)

( * ) Notice: Subject to any disclaimer, the term of this patent is extended or adjusted under 35 U.S.C. 154(b) by 418 days.

(21) Appl. No.: 11/123,188

(22) Filed: May 6, 2005

(65) Prior Publication Data
US 2006/0022219 A1 Feb. 2, 2006

(30) Foreign Application Priority Data
Jul. 29, 2004 (DE) .................. 10 2004 037 524
Nov. 29, 2004 (KR) .................. 10-2004-0098823

(51) Int. Cl.
*H01L 35/24* (2006.01)
*H01L 51/00* (2006.01)

(52) U.S. Cl. .............. 257/40; 257/79; 257/E39.007

(58) Field of Classification Search .......... 257/40, 257/79, E39.007, E33.001
See application file for complete search history.

(56) References Cited

U.S. PATENT DOCUMENTS 5,494,773 A * 2/1996 Tan et al. .................. 430/192

2003/0083203 A1 5/2003 Hashimoto et al.
2004/0038616 A1 2/2004 Toyoda et al.
2004/0043691 A1 3/2004 Abe et al.
2005/0202274 A1* 9/2005 Elschner et al. ............ 428/690
2006/0211797 A1* 9/2006 Tsuji et al. .................. 524/324

FOREIGN PATENT DOCUMENTS

| DE | 42 44 838 C2 | 1/1997 |
|----|--------------|--------|
| EP | 1 349 135 A1 | 1/2003 |
| JP | 09069334 | 3/1997 |
| JP | 10326559 | 12/1998 |
| JP | 2000019497 | 1/2000 |
| JP | 2003248240 | 9/2003 |
| JP | 2004079526 | 3/2004 |

OTHER PUBLICATIONS

*19.5L: Late-News Paper: Inkjet-Printed Bus and Address Electrodes for Plasma Display;* M. Furusawa, et al.; SID 02 Digest; pp. 753-755.

* cited by examiner

*Primary Examiner*—Hoai V Pham
(74) *Attorney, Agent, or Firm*—H.C. Park & Associates, PLC

(57) ABSTRACT

The present invention provides a display including a substrate and an electrode layer including a plurality of conductors, wherein a silane derivative layer is interposed between the substrate and the electrode layer to increase the bond strength between the substrate and the electrode layer. The invention also provides a method of manufacturing the device.

10 Claims, 3 Drawing Sheets

DISPLAY AND METHOD FOR MANUFACTURING THE SAME

CROSS REFERENCE TO RELATED APPLICATION

This application claims priority to and benefit of German Patent Application No. DE 10 2004 037 524.0, filed on Jul. 29, 2004, in the German Patent Office and Korean Patent Application No. 10-2004-0098823, filed on Nov. 29, 2004, in the Korean Patent Office, the disclosures of which are incorporated herein in their entireties by reference.

BACKGROUND OF THE INVENTION

1. Field of the Invention

The present invention relates to a display, and more particularly, to a display that includes a substrate, an electrode layer that has a plurality of conductors, and a silane derivative layer that is interposed between the substrate and the electrode layer. The silane derivative layers enhance the bond strength between the substrate and the electrode layer. The present invention also relates to a method for manufacturing the display.

2. Description of the Background

Inkjet-printed bus electrodes and address electrodes are printed using ink that contains metal nanoparticles. For example, EP1349135 A1 and US20040043691 A1 disclose a silver nano-ink that contains a dispersion of silver nanoparticles, a surfactant, and an organic metal.

US 20040038616 A1 discloses a method of manufacturing a flat monitor screen in which grooves are milled or etched into a glass and address electrodes are printed by inkjet printing.

Another approach for inkjet printing narrow metal lines onto a glass or indium tin oxide (ITO) substrate involves a plasma substrate pretreatment that places the contact angle between the substrate and metal ink within the range of 30 to 60 degrees. This allows uncontrolled diffusion of the ink on the substrate to be prevented (see U.S. Application No. 2003 0083203 A1 and M. Furusawa et al., SID 02 Digest, 753-755). Generally, a contact angle of 20 to 60 degrees is obtained by plasma fluorination with $CF_4$, $C_2F_6$, or $C_3F_8$. However, this method has the disadvantage that the viscosity or bond strength of printed and sintered ink on the substrate is very low.

SUMMARY OF THE INVENTION

The present invention provides a display that includes a substrate and an electrode layer that has a plurality of conductors, where a silane derivative layer is interposed between the substrate and the electrode layer. The display has a contact angle of 30 to 60 degrees between the substrate and metal ink. In particular, bus electrodes and address electrodes for a plasma display panel can be inkjet printed on the plasma display panel to achieve high bond strength between electrically conductive metal lines (i.e., conductors constituting an electrode layer) and a glass or ITO substrate. This configuration enhances the resolution of the conductors inkjet-printed on the glass or the ITO substrate and prevents the separation or damage to the conductors which causes product defects and results in low performance.

The present invention also provides a method of manufacturing the display.

Additional features of the invention will be set forth in the description which follows, and in part will be apparent from the description, or may be learned by practice of the invention.

The present invention discloses a display that comprises a substrate, an electrode layer comprising a plurality of conductors, and a silane layer that is interposed between the substrate and the electrode layer.

The present invention also discloses a method of fabricating a display that comprises preparing a substrate, forming a silane derivative layer on the substrate, and forming an electrode layer comprising a plurality of conductors on the silane derivative layer.

It is to be understood that both the foregoing general description and the following detailed description are exemplary and explanatory and are intended to provide further explanation of the invention as claimed.

BRIEF DESCRIPTION OF THE DRAWINGS

The above and other features and advantages of the present invention will become more apparent by describing in detail exemplary embodiments thereof with reference to the attached drawings.

DETAILED DESCRIPTION OF THE INVENTION

Figure 1:
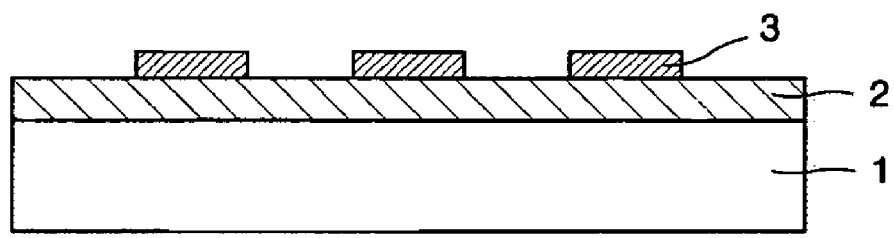
FIG. 1 is a schematic view of a display that includes a substrate and an electrode layer according to an exemplary embodiment of the present invention.

Exemplary embodiments of the invention will now be described more fully with reference to the accompanying drawings. The same reference numerals refer to the same constitutional elements throughout the drawings.

The above-described features of the present invention are accomplished by providing a display that includes a substrate, an electrode layer comprising a plurality of conductors, and a silane derivative layer interposed between the substrate and the electrode. The The above-described features of the present invention are accomplished by providing a display that includes a substrate, an electrode layer comprising a plurality of conductors, and a silane derivative layer interposed between the substrate and the electrode layer. The silane derivative layer, also referred to as the "interim layer," can be formed by plasma polymerization or by deposition using an appropriate solution to obtain a thin layer with desired surface characteristics.

FIG. 1 is a schematic sectional view of a display that includes a substrate, a silane derivative layer, and an electrode layer including a plurality of conductors according to the present invention.

Referring to FIG. 1, the display includes a substrate 1. The substrate 1 is selected according to the type of the display to be manufactured and can be easily understood by those of ordinary skill in the art. Preferably, the substrate 1 is a glass substrate or a substrate coated with ITO.

A silane derivative layer 2 is formed on the substrate 1 and must be strongly bonded to the substrate 1. A strong bond can be accomplished using a corresponding reactive group or a cationic group contained in a material constituting the silane derivative layer 2.

An electrode layer 3 including the plurality of the conductors is formed on the silane derivative layer 2. The electrode layer 3 is preferably formed by inkjet-printing a metal-containing solution or a metal-containing suspension. There must be a strong bond between the silane derivative layer 2 and an electrode layer 3 including a plurality of conductors. To increase the bond strength between the conductors and the silane derivative layer 2, corresponding chemical anchor groups may comprise the silane derivative layer 2. When using silver as a deposition metal for the electrode layer 3, it is preferred that the silane derivative layer 2 includes a sulfur-containing material, such as a dialkyl sulfide group as well as a thiol group or a disulfide group. It may also include a nitrogen-containing material, such as an amine group. Further, the silane derivative layer 2 may also include chelate groups such as ethylenediamine and diethylenetriamine as well as carboxylates.

Preferably, the silane derivative layer 2 is made of hexamethyldisiloxane or hexamethyldisilizane, or a mixture of one or more compounds including, but not limited to dimethyldiethoxysilane, trimethoxy-propylsilane, bis-tetramethylammoniumsiloxanolate, 3-mercaptopropyl-trimethoxylsilane, bis (3-trimethoxysilyl) propyl-ethylenediamine, 3-(trimethoxysilyl) propyl-diethylene triamine, N-trimethoxysilylpropyl-ethylenediamine tetraacetic acid, and a salt thereof.

Preferably, the mixture further includes one or more additives including but not limited to silicon dioxide particles, silicate, and suspension polymer. The suspension polymer may include polydimethylsiloxane, for example.

The silane derivative layer 2 made of silane derivative may be formed by plasma polymerization, plasma deposition such as plasma enhanced chemical vapor deposition (PECVD), spin-coating, spray coating, or screen printing. When using plasma polymerization, spin-coating, or spraying, the silane derivative layer 2 is formed to a thickness of 1 to 50 nm. When using screen printing, the silane derivative layer 2 is formed to a thickness of 50 nm to 10 μm.

A display according to the present invention may be a liquid crystal display (LCD), an organic light-emitting display (OLED), or a plasma display panel (PDP).

Such display includes a basic substrate, an electrode layer including a plurality of conductors, and a silane derivative layer between the electrode layer and the substrate. Preferably, the electrode layer 3 including the plurality of the conductors forms address electrodes or bus electrodes of a display.

Figure 2:
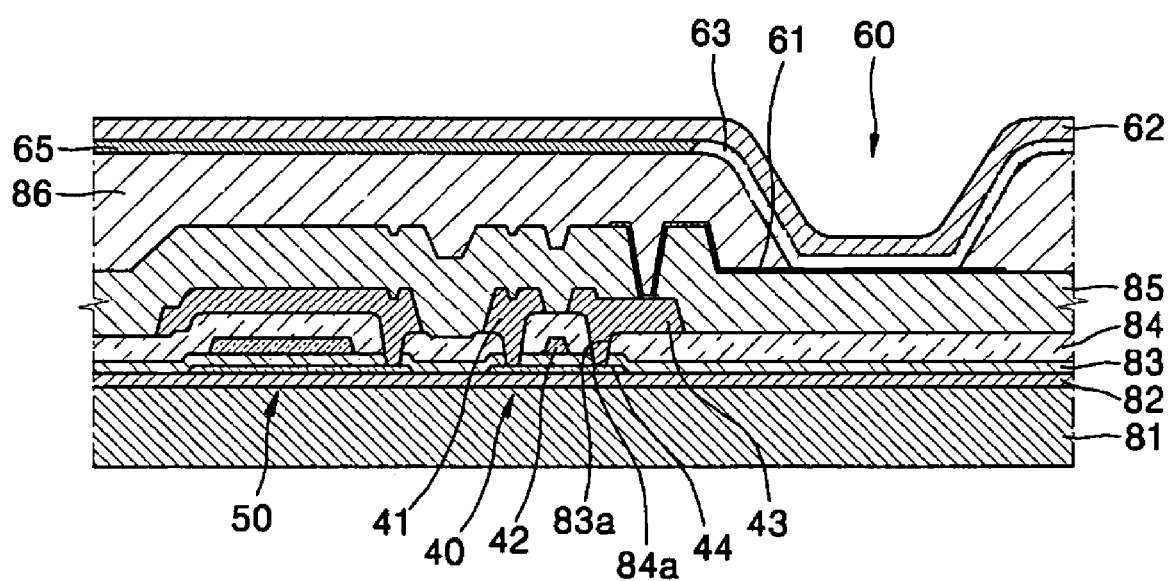
FIG. 2 is a schematic sectional view of an organic light-emitting display according to an exemplary embodiment of the present invention.

FIG. 2 is a schematic sectional view of an active matrix OLED according to an exemplary embodiment of the present invention that includes a capacitor 50, a driving thin film transistor (TFT) 40, and an organic light-emitting device 60.

The active matrix OLED includes a substrate 81 that may be made of a transparent material such as glass or a plastic material. A buffer layer 82 is formed on the entire surface of the substrate 81.

An active layer 44 is formed in a predetermined pattern on the buffer layer 82. The active layer 44 is buried under a gate insulating layer 83. The active layer 44 may be made of a p-type or n-type semiconductor.

A gate electrode 42 of the driving TFT 40 corresponding to the active layer 44 is formed on the gate insulating layer 83. The gate electrode 42 is buried under an inter-insulating layer 84. After forming the inter-insulating layer 84, the gate insulating layer 83 and the inter-insulating layer 84 are dry etched to form contact holes 83a and 84a that partially expose the active layer 44.

The exposed portions of the active layer 44 are connected to a source electrode 41 and a drain electrode 43 of the driving TFT 40 that are formed in a predetermined pattern at both sides of the active layer 44 via the contact holes 83a and 84a. The source electrode 41 and the drain electrode 43 are buried under a protection layer 85. The protection layer 85 is etched to partially expose the drain electrode 43.

The protection layer 85 is made of an insulator and may be formed as an inorganic layer made of silicon oxide or silicon nitride or as an organic layer made of acrylic or benzocyclobutene (BCB). The protection layer 85 may be covered with a separate insulating layer to planarize the protection layer 85.

Meanwhile, the organic light-emitting device 60 emits red, green, or blue light depending on current flow, thereby displaying predetermined image information. The organic light-emitting device 60 includes a first electrode 61 which is a pixel electrode that is connected to the drain electrode 43 of the driving TFT 40 and a second electrode 62 that covers all the pixels. It also includes an organic emission layer 63 that is interposed between the first electrode 61 and the second electrode 62. The organic emission layer 63 may be formed along a pixel defining layer 86. The pixel defining layer 86 may be made of an inorganic insulating material such as silicon oxide or silicon nitride or an organic insulating material, for example.

The organic emission layer 63 may be comprised of low molecular weight or high molecular weight organic molecules. The low molecular organic layer may have a single- or multi-laminated structure including a hole injection layer (HIL), a hole transport layer (HTL), an emission layer (EML), an electron transport layer (ETL), and an electron injection layer (EIL). The organic material to be used as the low molecular weight organic layer may include, but is not limited to copper phthalocyanine (CuPc), N,N-di(naphthalene-1-yl)-N,N'-diphenyl benzidine (NPB), or tris-8-hydroxyquinoline aluminum (Alq3). The low molecular organic layer may be formed by vacuum deposition.

The high molecular weight organic layer may be composed of a hole transport layer (HTL) and an emission layer (EML). In this case, the hole transport layer may be made of poly (ethylenedioxy)thiophene (PEDOT) and the emission layer may be made of a high molecular weight organic material such as poly(phenylene vinylene) (PPV) and polyfluorene, for example. The hole transport layer and the emission layer may be formed by screen printing or inkjet printing. However, the structure of the organic emission layer 63 of the present invention is not limited to the structure described above.

The first electrode 61 may be an anode and the second electrode 62 may be a cathode. Alternately, the first electrode 61 may be a cathode and the second electrode 62 may be an anode. The first electrode 61 may be patterned to correspond to each pixel and the second electrode 62 may cover all pixels.

The first electrode 61 may be a transparent electrode or a reflective electrode. When the first electrode 61 is a transparent electrode, it may be formed of ITO, IZO, ZnO, or $In_2O_3$. When the first electrode 61 is a reflective electrode, a transparent electrode layer made of ITO, IZO, ZnO, or $In_2O_3$ may be formed on a reflective layer made of Ag, Mg, Al, Pt, Pd, Au, Ni, Nd, Ir, Cr, or a compound thereof.

The second electrode 62 is made of a low work function material so that it can easily supply electrons to the emission layer of the organic emission layer 63. Examples of the low work function material include, but are not limited to, two or more of Li, Ca, Al, Ag, and Mg. In particular, since the second electrode 62 is used as a cathode when it is a transparent electrode, an auxiliary electrode layer or a bus electrode line made of ITO, IZO, ZnO, or $In_2O_3$ may also be formed after a low work function metal is deposited on the organic emission layer 63.

A silane derivative layer 65 according to the present invention may be interposed between the second electrode 62 and the pixel defining layer 86. The silane derivative layer 65 is formed on the pixel defining layer 86 and increases the bond strength between the second electrode 62 and the pixel defining layer 86.

FIG. 2 illustrates an OLED that includes the silane derivative layer 65 positioned between the second electrode 62 and the pixel defining layer 86 but is not limited thereto. Various changes include interposing a silane derivative layer according to the present invention between the protection layer 85 and the first electrode 61, between the gate electrode 42 and the gate insulating layer 83, or between the source electrode 41/drain electrode 43 and the inter-insulating layer 84, to increase the bond strength therebetween.

Figure 3:
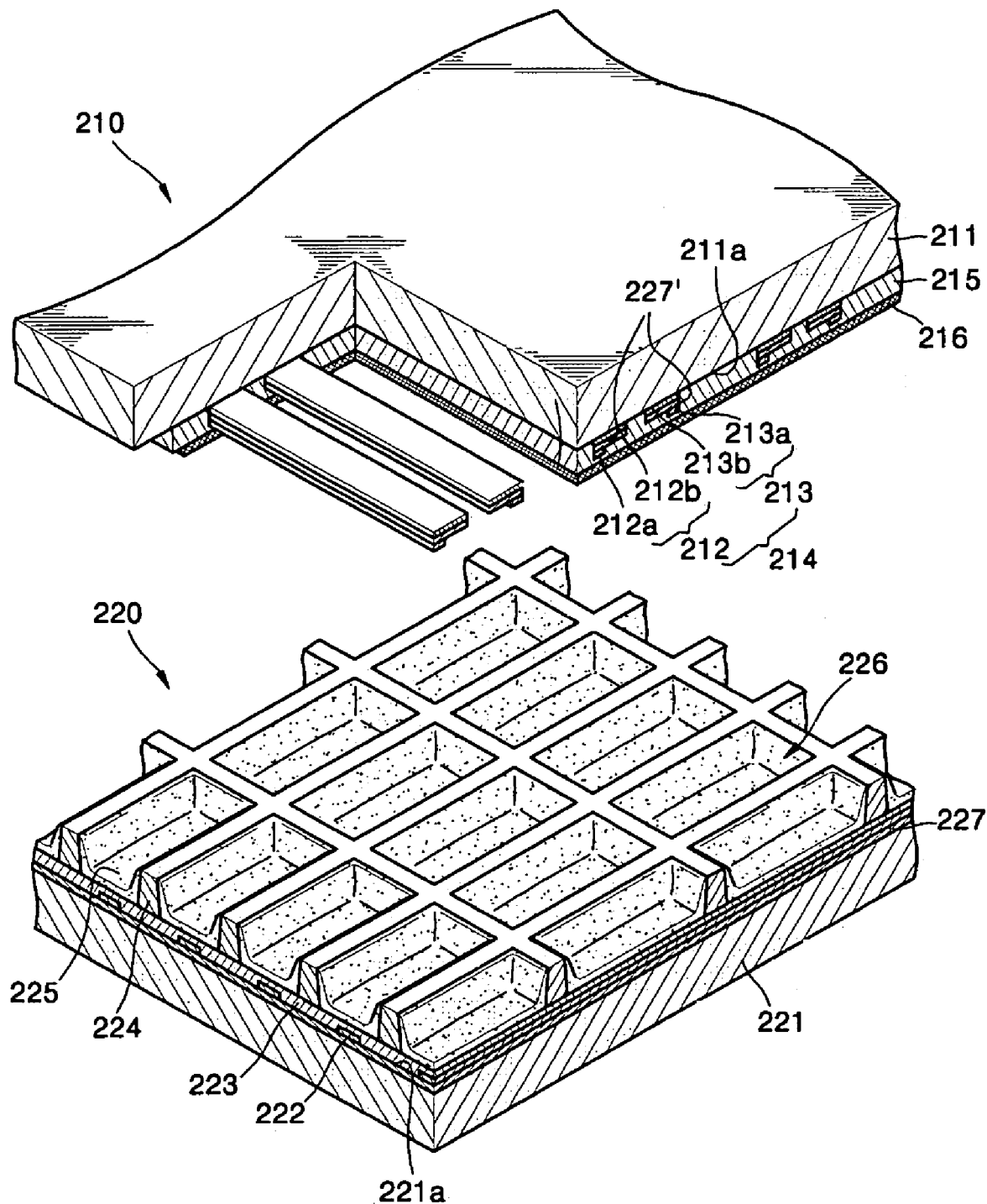
FIG. 3 is a partially cut perspective view of a plasma display panel according to an exemplary embodiment of the present invention.

FIG. 3 schematically illustrates a partially cut perspective view of a PDP according to an embodiment of the present invention.

The PDP of FIG. 3 largely includes a front plate 210 and a rear plate 220 that bonds parallel to the front plate 210. The front plate 210 is formed with a front substrate 211 and the rear plate 220 is formed with a rear substrate 221. A plurality of discharge cells 226 and a non-discharge region are defined by a barrier rib 224 between the front substrate 211 and the rear substrate 221. The discharge cells 226 form discharge regions and the barrier rib 224 serves to prevent optical crosstalk among the discharge cells 226.

The sustain electrode pairs 214 are formed on a lower surface 211a of the front plate 210. Since visible light generated from the discharge cells 226 passes through the front substrate 211, the front substrate 211 is made of a transparent material, mainly glass.

The sustain electrode pairs 214 are formed on a lower surface of the front substrate 211 to generate a sustain discharge. The sustain electrode pairs 214 are parallel to each other and are separated from each other by a predetermined distance on the front substrate 211. Each pair of the sustain electrode pairs 214 includes an X electrode 212 and a Y electrode 213. In the present embodiment, the sustain electrode pairs 214 are formed on the lower surface of the front substrate 211, but the arrangement of the sustain electrode pairs 214 is not so limited. For example, the sustain electrode pairs 214 may be separated from the lower surface of the front substrate 211 by a predetermined distance. However, it is preferable that the sustain electrode pairs 214 are disposed at the same level from the front substrate 211.

The X electrode 212 and the Y electrode 213 are parallel to each other and are separated from each other by a predetermined distance. They extend in the x direction through the discharge cells 226. The X electrode 212 and the Y electrode 213 are made of a metal and are narrow in width. The X electrode 212 and the Y electrode 213 may have a mono-layer structure using a metal such as Ag, Al, or Cu, or a multi-layer structure made of Cr/Al/Cr. The X electrode 212 includes a transparent electrode 212b and a bus electrode 212a. The Y electrode 213 includes a transparent electrode 213b and a bus electrode 213a. The transparent electrodes 212b and 213b may be made of ITO, IZO, $In_2O_3$, or the like, and the bus electrodes 212a and 213a may be made of a metal including, but not limited to, Al, Ag, or Mg.

A silane derivative layer 227' according to the present invention is also interposed between the transparent electrode 212b and the bus electrode 212a and between the transparent electrode 213b and the bus electrode 213a. By the silane derivative layer 227', the bond strength between the transparent electrodes 212b and 213b and the bus electrodes 212a and 213a can be increased.

The front substrate 211 including the sustain electrode pairs 214 is formed with a first dielectric layer 215 that covers the sustain electrode pairs 214. The first dielectric layer 215 is made of a dielectric material that is capable of inducing charges as well as preventing electrical connection between the adjacent X electrode 212 and the Y electrode 213. It also prevents damage to the X electrode 212 and the Y electrode 213 by direct collision of cations or electrons with the X electrode 212 and the Y electrode 213. The dielectric material may be PbO, $B_2O_3$, $SiO_2$, or the like.

A protection layer 216, commonly made of MgO, is formed on a lower surface of the first dielectric layer 215. The protection layer 216 prevents damage to the first dielectric layer 215 by collision of cations and electrons with the first dielectric layer 215 upon discharging. The protection layer 216 has good light transmittance and emits a large number of secondary electrons upon discharging. In particular, the protection layer 216 made of MgO is mainly formed as a thin layer by sputtering or E-beam evaporation.

Address electrodes 222 are disposed on a front surface 221a of the rear substrate 221 opposite to the sustain electrode pairs 214 of the front substrate 211. The address electrodes 222 extend through the discharge cells 226 to intersect with the X electrode 212 and the Y electrode 213 at the individual discharge cells 226. Preferably, these address electrodes 222 are disposed on the rear substrate 221 corresponding to the center portions of the discharge cells 226.

The address electrodes 222 are used to generate an address discharge for facilitating the sustain discharge between the X electrode 212 and the Y electrode 213. Particularly, the address electrodes 222 lower the voltage for the sustain discharge. The address electrodes 222 may be made of various metals including, but not limited to Ag, Mg, or Al.

A silane derivative layer 227 according to the present invention is interposed between the address electrodes 222 and the rear substrate 221. The silane derivative layer 227 increases the bond strength between the address electrodes 222 and the rear substrate 221.

A second dielectric layer 223 is formed on the rear substrate 221 to cover the address electrodes 222. The second dielectric layer 223 is made of a dielectric material that is capable of inducing charges as well as preventing damage to the address electrodes 222 by collision of cations or electrons with the address electrodes 222 upon discharging. The dielectric material may include, but is not limited to PbO, $B_2O_3$, $SiO_2$, etc.

A red-, green- or blue-phosphor layer 225 is formed on a front surface of the second dielectric layer 223 in the discharge cells 226 that are partitioned by the barrier ribs 224 and is also formed on a sidewall of the barrier rib 224. The phosphor layer 225 includes a component that emits visible light after absorbing UV light. A red-emitting phosphor layer formed in a red light discharge cell includes a phosphor such as $Y(V,P)O_4$:Eu, a green-emitting phosphor layer formed in a green light discharge cell includes a phosphor such as $Zn_2SiO_4$:Mn, and a blue-emitting phosphor layer formed in a blue light discharge cell includes a phosphor such as BAM:Eu.

The discharge cells 226 are filled with a mixed discharge gas composed of neon (Ne), xenon (Xe), for example. In this state, the front substrate 211 and the rear substrate 222 are coupled and sealed by a sealing member such as a frit glass formed at the outermost edges of the front substrate 211 and the rear substrate 221.

A PDP according to the present invention has been illustrated with reference to FIG. 3, but various changes thereof may be made, which are also within the scope of the present invention.

A method of manufacturing a display according to an embodiment of the present invention will now be described with reference to FIG. 4A, FIG. 4B, and FIG. 4C.

Figure 4A:
FIG. 4A, FIG. 4B, and FIG. 4C are sectional views that illustrate a method of manufacturing a display according to an exemplary embodiment of the present invention.

First, referring to FIG. 4A, a substrate 11 such as a glass substrate or an ITO-coated substrate, for example is prepared. The preparation may further include washing the substrate 11.

Figure 4B:
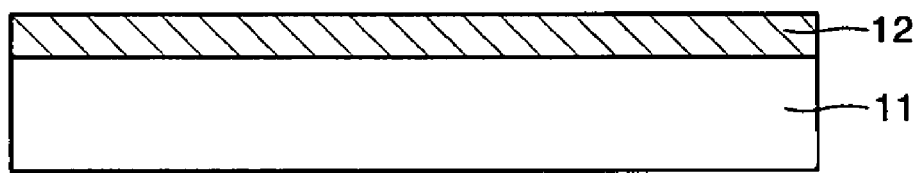

Next, referring to FIG. 4B, a silane derivative layer 12 is formed on the substrate 11. The silane derivative layer 12 may preferably be made of hexamethyldisiloxane or hexamethyldisilazane. Alternatively, the silane derivative layer 12 may be made of a mixture of one or more compounds including, but not limited to dimethyldiethoxysilane, trimethoxy-propylsilane, bis-tetramethylammoniumsiloxanolate, 3-mercapto-propyl-trimethoxylsilane, bis (3-trimethoxysilyl) propyl-ethylenediamine, 3-(trimethoxysilyl) propyl-diethylene triamine, N-trimethoxysilylpropyl-ethylenediamine tetraacetic acid, and a salt thereof. Preferably, the mixture further includes one or more additives including, but not limited to silicon dioxide particles, silicate, and suspension polymer. Preferably, the suspension polymer includes polydimethylsiloxane.

The silane derivative layer 12 is not an electrical insulator. However, it is preferable that the silane derivative layer 12 is at least electrically insulated in a traverse direction to the longitudinal axis of conductors constituting an electrode layer. This can be accomplished by forming a thin silane derivative layer 12 corresponding to a mono-layer. According to the present invention, the silane derivative layer 12 has one or more bonds including, for example, Si—O bond, Si—N bond, Si—P bond, Si—C bond, Si—H bond, and Si—Si bond.

Figure 4C:
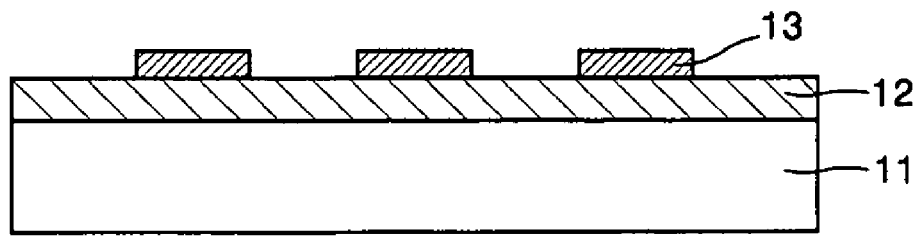

Next, referring to FIG. 4C, an electrode layer 13 including a plurality of conductors is formed on the silane derivative layer 12. The conductors are a plurality of metal lines or metal-containing lines. For example, the conductors may comprise silver (Ag) or other metal particle-containing lines.

The conductors are formed by inkjet printing in which ink containing metal particles such as silver particles constituting the conductors, are printed onto the substrate 11 having the silane derivative layer 12 by a line formation method. To achieve high resolution conductors with a narrow linewidth, it is preferable to use a printhead that forms small ink droplets onto a substrate that has been pretreated. The silane derivative layer 12 can also be formed by, a plasma treatment such as PECVD, for example, so that a high contact angle with respect to printed ink is achieved. Therefore, uncontrolled diffusion of ink is prevented.

The same substrate can undergo repeated printing which can increase the thickness of individual metal lines that are the conductors constituting the electrode layer 13.

A heat treatment process results in conductors that are made of silver, for example, with maximum conductivity. Preferably, the heat treatment is performed at 100-300 C for 5-30 minutes. During the heat treatment, the Ag particles constituting the conductors of the electrode layer 13 are sintered. This results in conductors of the electrode layer 13 with a line resistance of less than 1 Ohm/cm.

In the above-described display manufacturing method, the display may be a LCD, an OLED, or a PDP.

Referring to FIG. 2, an OLED manufacturing method includes forming the silane derivative layer 65 on the pixel defining layer 86 as described above and then forming the second electrode 62 on the silane derivative layer 65. In addition, an OLED manufacturing method may additionally include forming the gate electrode 42 after forming a silane derivative layer on the gate insulating layer 83, forming the source electrode 41 and the drain electrode 43 after forming a silane derivative layer on the inter-insulating layer 83, and forming the first electrode 61 after forming a silane derivative layer on the protection layer 85. The gate electrode 42, the source electrode 41, the drain electrode 43, the first electrode 61, the second electrode 62, etc. may be formed by inkjet printing, for example.

Various subsequent processes may also be performed. For those subsequent processes, reference can be made to conventional OLED manufacturing methods disclosed in Korean Patent Laid-Open Publication Nos. 2004-39789, 2002-78535, 2002-71660, etc., the disclosures of which are incorporated herein in their entireties by reference. For example, fabricating an OLED, after forming a substrate, a silane derivative layer, and an electrode layer including a plurality of conductors, an organic emission layer may also be formed.

Referring to FIG. 3, a PDP manufacturing method may further include forming the silane derivative layer 227 on the rear substrate 221 and then forming the address electrodes 222 on the silane derivative layer 227, and forming the silane derivative layer 227' on the transparent electrodes 212b and 213b and then forming the bus electrodes 212a and 213a on the silane derivative layer 227.' The address electrodes 222, the bus electrodes 212a and 213a, etc. may be formed by inkjet printing, for example.

Various subsequent processes may also be performed. For these subsequent processes, reference can be made to conventional PDP manufacturing methods disclosed in Korean Patent Nos. 0453891, 0445031, 0441517, etc., the disclosures of which are incorporated herein in their entireties by reference.

The present invention will now be described in more detail in an example of a method of fabricating a PDP as illustrated generally in FIG. 4A, FIG. 4B, and FIG. 4C.

EXAMPLE

In this example, a PDP including a substrate, an electrode layer including a plurality of conductors, and a silane derivative layer interposed between the substrate and the electrode layer is fabricated. Bus and address electrodes of the PDP are formed on two different substrates, which may be a glass substrate (for address electrodes) and an ITO-coated glass substrate (for bus electrodes).

First, a washed glass substrate was prepared.

The washed glass substrate was subjected to plasma polymerization method such as PECVD using HMDSO (hexamethyldisiloxane) to form a silane derivative layer with a thickness of 5 nm. The contact angle of silver ink droplets on the silane derivative layer was about 30 degrees. At this time, parameters for the plasma polymerization are listed in Table 1 below:

TABLE 1

| | |
|---|---|
| Pressure | $5 \times 10^{-2}$ mbar |
| Power | 200 W |

TABLE 1-continued

| | |
|---|---|
| RF-frequency | 13.56 MHz |
| Flow rate of HMDSO (monomer) | 5.5 sccm |
| Time | 10 seconds |

A dispersion of silver nanoparticles with a particle size of about 7 nm in an organic solvent was prepared as silver ink. The silver ink was printed on the silane derivative layer formed on the substrate using a piezo printhead. This step was followed by drying to form address electrodes with a linewidth of 100 μm.

Similarly to the above-described method, the silver ink-printed substrate was heat treated at 250° C. During the heat treatment, silver nanoparticles were sintered to obtain address electrodes and a thickness of 2 μm or more.

While the present invention has been particularly shown and described with reference to exemplary embodiments thereof, it will be understood by those of ordinary skill in the art that various changes in form and details may be made therein. Thus, it is intended that the present invention cover the modifications and variations of this invention provided they come within the scope of the appended claims and their equivalents.

What is claimed is:

1. A display, comprising:
   a substrate;
   an electrode layer comprising a plurality of conductors, and
   a silane derivative layer interposed between the substrate and the electrode layer,
   wherein the silane derivative layer comprises one or more additives selected from the group consisting of silicon dioxide particals, silicate, and suspension polymer.

2. The display of claim 1, wherein the substrate is a glass substrate or an Indium Tin oxide (ITO)-coated substrate.

3. The display of claim 1, wherein the silane derivative layer has one or more bonds selected from the group consisting of a Si—O bond, Si—N bond, Si—P bond, Si—C bond, Si—H bond, and Si—Si bond.

4. The display of claim 1, wherein the silane derivative layer is made of hexamethyldisiloxane or hexamethyldisilazane.

5. The display of claim 1, wherein the silane derivative layer further comprises a mixture of one or more compounds selected from the group consisting of dimethyldiethoxysilane, trimethoxy-propylsilane, bis-tetramethylammoniumsiloxanolate, 3-mercaptopropyl-trimethoxylsilane, bis (3-trimethoxysilyl) propyl-ethylenediamine, (3-trimethoxysilyl) propyl-diethylene triamine, N-trimethoxysilylpropyl-ethylenediamine tetraacetic acid, and a salt thereof.

6. The display of claim 1, wherein the suspension polymer comprises polydimethylsiloxane.

7. The display of claim 1 wherein the silane derivative layer has a thickness of 1-50nm.

8. The display of claim 1, wherein the silane derivative layer has a thickness of 50 nm to 10 μm.

9. The display of claim 1, wherein the display is a liquid crystal display (LCD), an organic light-emitting display (OLED), or a plasma display panel (PDP).

10. The display of claim 1, wherein the plurality of the conductors are address electrodes or bus electrodes.

* * * * *